US009577163B2

(12) United States Patent
Chiu et al.

(10) Patent No.: US 9,577,163 B2
(45) Date of Patent: Feb. 21, 2017

(54) LIGHT EMITTING DIODE PACKAGE AND METHOD THEREOF

(71) Applicant: ADVANCED OPTOELECTRONIC TECHNOLOGY, INC., Hsinchu Hsien (TW)

(72) Inventors: Ching-Hsueh Chiu, Hsinchu (TW); Ya-Wen Lin, Hsinchu (TW); Po-Min Tu, Hsinchu (TW); Shih-Cheng Huang, Hsinchu (TW)

(73) Assignee: ADVANCED OPTOELECTRONIC TECHNOLOGY, INC., Hsinchu Hsien (TW)

( * ) Notice: Subject to any disclaimer, the term of this patent is extended or adjusted under 35 U.S.C. 154(b) by 0 days.

(21) Appl. No.: 14/835,954

(22) Filed: Aug. 26, 2015

(65) Prior Publication Data

US 2016/0240752 A1   Aug. 18, 2016

(30) Foreign Application Priority Data

Feb. 12, 2015   (CN) .......................... 2015 1 0074191

(51) Int. Cl.
| | |
|---|---|
| *H01L 33/54* | (2010.01) |
| *H01L 33/56* | (2010.01) |
| *H01L 25/075* | (2006.01) |
| *H01L 33/50* | (2010.01) |
| *H01L 33/62* | (2010.01) |
| *H01L 33/52* | (2010.01) |
| *H01L 33/58* | (2010.01) |

(52) U.S. Cl.
CPC .......... *H01L 33/54* (2013.01); *H01L 25/0753* (2013.01); *H01L 33/507* (2013.01); *H01L 33/52* (2013.01); *H01L 33/56* (2013.01); *H01L 33/58* (2013.01); *H01L 33/62* (2013.01); *H01L 2933/005* (2013.01); *H01L 2933/0033* (2013.01); *H01L 2933/0066* (2013.01)

(58) Field of Classification Search
CPC .......... H01L 33/54; H01L 33/52; H01L 33/58
See application file for complete search history.

(56) References Cited

U.S. PATENT DOCUMENTS

| | | | |
|---|---|---|---|
| 2004/0238816 A1* | 12/2004 | Tano | .................... H01L 51/0004 257/40 |
| 2007/0241357 A1* | 10/2007 | Yan | ..................... H01L 25/0753 257/98 |
| 2008/0007939 A1* | 1/2008 | Lee | ................... G02F 1/133603 362/97.1 |

(Continued)

*Primary Examiner* — Joseph C Nicely
(74) *Attorney, Agent, or Firm* — Zhigang Ma

(57) ABSTRACT

The present disclosure provides a light emitting diode package including a substrate, a first electrode and a second electrode located on a first surface of the substrate, a plurality of light emitting diodes (LEDs) located between the first electrode and the second electrode, a plurality of retaining ring located on the first surface of the substrate. The LEDs are surrounded by the retaining ring therein. An encapsulation layer is mounted in the retaining ring and covers the LEDs therein. The encapsulation layer includes a first surface and an side surface extending from edges of the first surface. The side of the encapsulation layer contacts an inner surface of the retaining ring. The present disclosre also provides a method for manufacturing the above light emitting diode package.

16 Claims, 8 Drawing Sheets

(56) References Cited

U.S. PATENT DOCUMENTS

| | | | |
|---|---|---|---|
| 2008/0029775 A1* | 2/2008 | Liu | H01L 33/52 257/98 |
| 2009/0109688 A1 | 4/2009 | Hsu et al. | |
| 2009/0134417 A1 | 5/2009 | Sato et al. | |
| 2009/0273004 A1* | 11/2009 | Lin | H01L 23/13 257/99 |
| 2012/0146066 A1* | 6/2012 | Tischler | H01L 51/50 257/89 |
| 2013/0001623 A1* | 1/2013 | Wen | H01L 33/54 257/98 |
| 2013/0087822 A1 | 4/2013 | Kim | |
| 2013/0168726 A1* | 7/2013 | Park | B29C 45/14655 257/100 |
| 2013/0248906 A1 | 9/2013 | Wang | |
| 2013/0270594 A1* | 10/2013 | Cai | H01L 33/48 257/98 |
| 2014/0004631 A1* | 1/2014 | Chang | H01L 33/58 438/27 |
| 2014/0061683 A1* | 3/2014 | Chang | H01L 33/52 257/88 |
| 2015/0270462 A1* | 9/2015 | Ito | H01L 33/62 257/98 |
| 2015/0276152 A1* | 10/2015 | Su | F21K 9/56 362/84 |
| 2016/0118565 A1* | 4/2016 | Lin | H01L 33/641 257/99 |

\* cited by examiner

LIGHT EMITTING DIODE PACKAGE AND METHOD THEREOF

CROSS-REFERENCE TO RELATED APPLICATIONS

This application claims priority to Chinese Patent Application No. 201510074191.0 filed on Feb. 12, 2015, the contents of which are incorporated by reference herein.

FIELD

The subject matter herein generally relates to a light emitting diode package, and also relates to a method thereof.

BACKGROUND

A light emitting diode (LED) package generally includes a substrate, an LED chip mounted on the substrate, and an encapsulation layer formed on the substrate and covering the LED chip therein for preventing the LED chip from the water vapor and the dust. The encapsulation layer includes glue and phosphors mixed in the glue.

BRIEF DESCRIPTION OF THE DRAWINGS

Implementations of the present technology will now be described, by way of example only, with reference to the attached figures.

DETAILED DESCRIPTION OF EMBODIMENTS

It will be appreciated that for simplicity and clarity of illustration, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure. The description is not to be considered as limiting the scope of the embodiments described herein.

The term "comprising" means "including, but not necessarily limited to"; it specifically indicates open-ended inclusion or membership in a so-described combination, group, series and the like.

Figure 1:
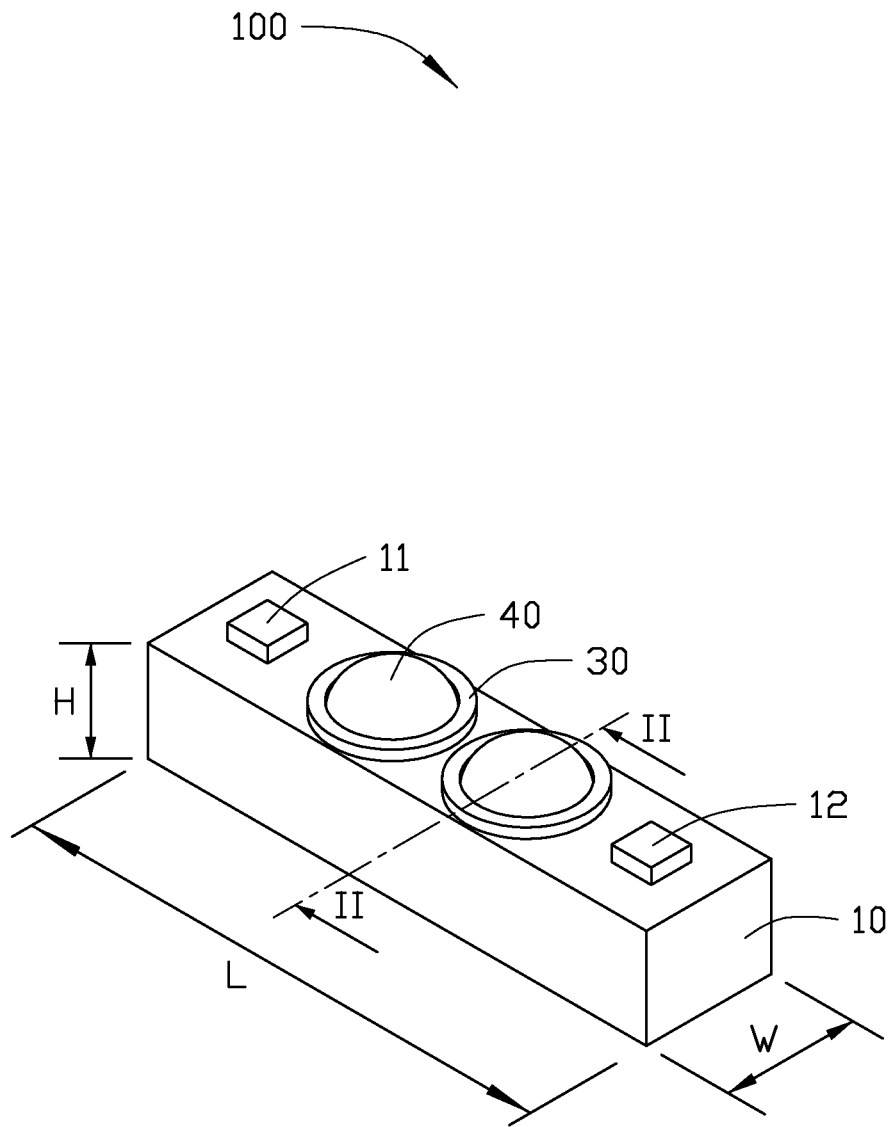
FIG. 1 is an isometric view of a light emitting diode package in accordance with one embodiment of the present disclosure.
Figure 2:
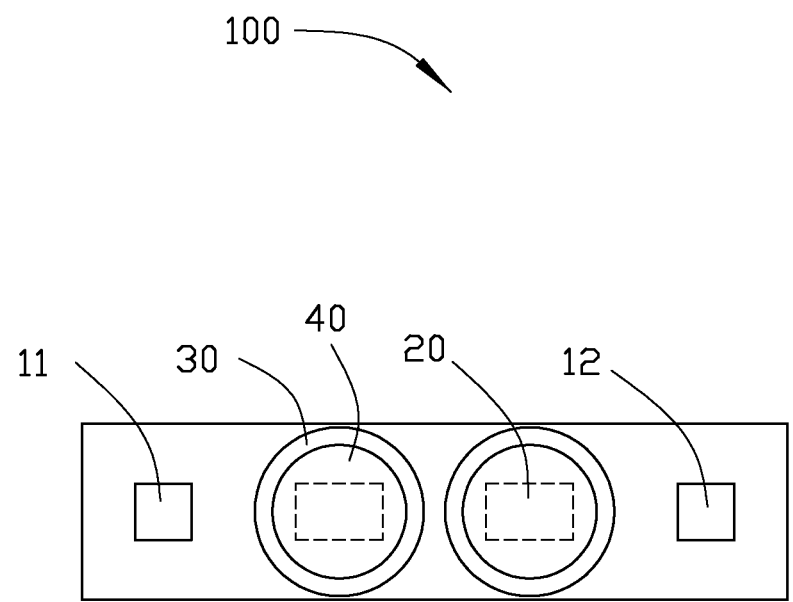
FIG. 2 is a top view of the light emitting diode package of FIG. 1.

As illustrated in FIGS. 1-2, a light emitting diode (LED) package 100 of the present disclosure includes a substrate 10, a plurality of LEDs 20, a first electrode 11, a second electrode 12 mounted on the substrate 10, a plurality of retaining rings 30 mounted on the substrate 10 and surrounding each of the LED 20, and a plurality of encapsulation layers 40 mounted correspondingly in the retaining rings 30 to cover each of the LED 20 therein.

The substrate 10 can be a rectangular shape, and made of transparent material, such as glass or sapphire etc. In the illustrated embodiment, a length of the substrate 10 is denoted by L, in one example the length can be 30 mm. A width of the substrate 10 is denoted by W, in one example the width can be 0.8 mm. A height of the substrate 10 is denoted by H, in one example the height can be 0.4 mm.

The substrate 10 includes a first surface 101 and a second surface 102 located opposite to the first surface 101. The first electrode 11 and the second electrode 12 are spaced from each other and respectively mounted on two ends of the first surface 101 of the substrate 10.

The LEDs 20 are mounted on the first surface 101 of the substrate 10 and located between the first electrode 11 and the second electrode 12. In the illustrated embodiment, the LED package 100 includes two LEDs 20 coupled with each other and connected with the first electrode 11 and second electrode 12 by wire.

Figure 3:
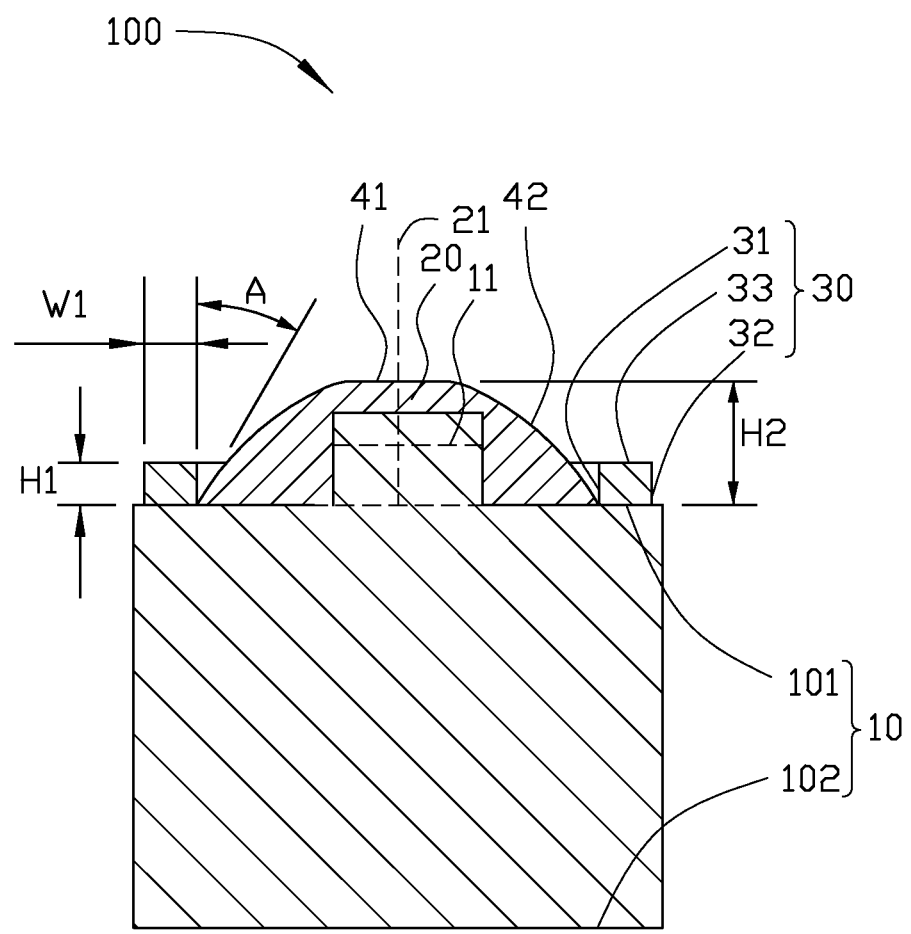
FIG. 3 is a cross sectional view of the light emitting diode package of in FIG. 1 taken along II-II line.

As illustrated in FIG. 3, the retaining ring 30 is made of hydrophobic material. Each of the retaining rings 30 is mounted on the first surface 101 of the substrate 10 and surrounds a corresponding LED 20 therein. In the illustrated embodiment, the retaining ring 30 is made of photoresist. A cross section of each retaining ring 30 is a circular shape. A height of each retaining ring 30 is denoted by H1. The height can be between 100 μm and 300 μm, in one example, the height is 200 μm. The width of each retaining ring 30 is denoted by W1. The width can be between 0.05 μm and 0.1 μm, in one example, the width is 0.07 μm.

The retaining ring 30 includes a first side wall 31 and a second side wall 32 located on the first surface 101 of the substrate 10, and a top wall 33 connecting with the first side wall 31 and the second side wall 32. In the illustrated embodiment, the first side wall 31 and the second side wall 32 are arc surfaces extending vertically from the first surface 101 of the substrate 10. The top wall 33 is arc surfaces parallel to the first surface 101 of the substrate 10.

The encapsulation layer 40 is made of glue and phosphors mixed in the glue. The encapsulation layer 40 is mounted on the first surface 101 and also surrounded by the retaining ring 30. The encapsulation layer 40 covers a corresponding LED 20 therein. Specifically, the encapsulation layer 40 includes a top surface 41 and a side surface 42 extended from a periphery of the top surface 41 to the first side wall 31 of the retaining ring 30. The side surface 42 of the encapsulation layer 40 contacts to the first side wall 31 of the retaining ring 30. A shape of the encapsulation layer 40 in cross-section is substantially a half circle shape with a top portion cut. The top surface 41 is a horizontal surface. The side surface 42 is a curved surface. In the illustrated embodiment, the side surface 42 of the encapsulation layer 40 and the first side wall 31 of the retaining ring 30 define an angle A, the angle A is between 30° and 60°, in one example, the angle A is 45°. A height of the encapsulation layer 40 is H2, the H2 is between 1 mm and 3 mm, in one example, the H2 is 2 mm. The encapsulation layer 40 is rotational symmetrical about an axis 21 of the corresponding LED 20.

Figure 4:
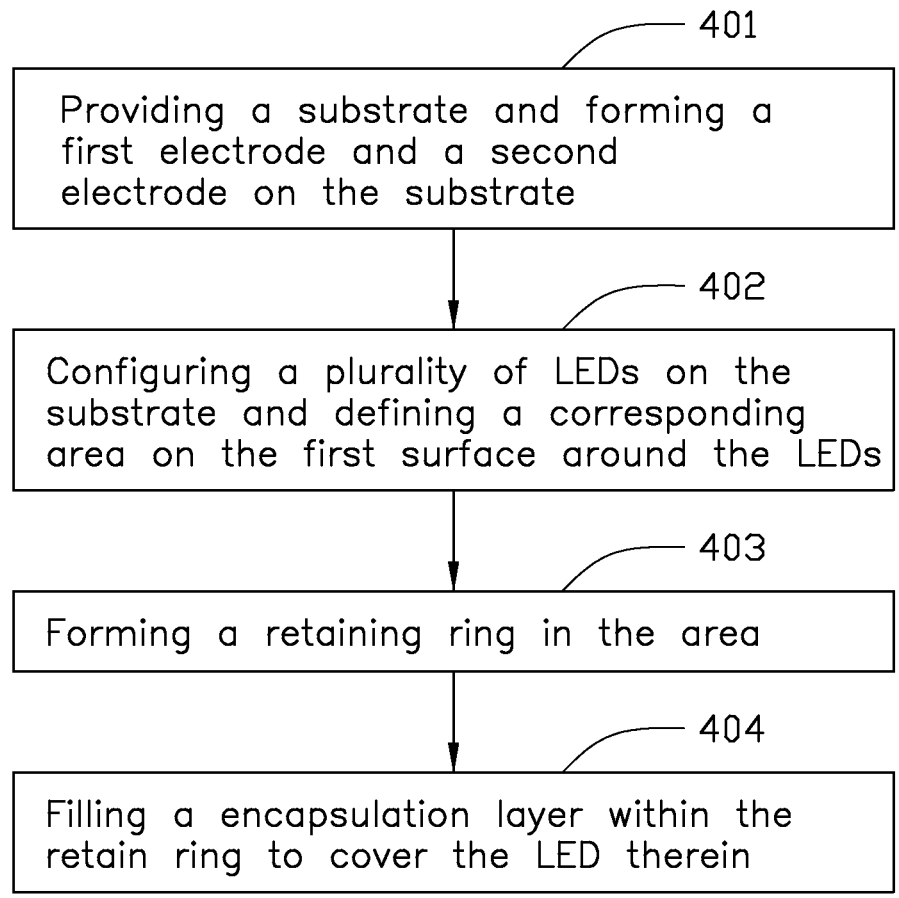
FIG. 4 is a flow chart of a method for forming a light emitting diode package of the present disclosure.

FIG. 4 illustrates a flow chart of a method for forming a light emitting diode package in accordance with the embodiment of the present disclosure. The example method is provided by way of example, as there are a variety of ways to carry out the method. The method described below can be carried our using the configurations illustrated in FIGS. 5-8, for example, and various elements of these figures are reference in explaining example method. Each block shown in FIG. 4 represents one or more processes, methods or subroutines, carried out in the example method. Additionally, the illustrated order of block is by example only and the order of the blocks can change according to the present disclosure. The example method can begin at block 401.

At block 401, providing a substrate 10 and forming a first electrode 11 and a second electrode 12 on the substrate 10.

At block 402, configuring the LEDs 20 on the first surface 101 of the substrate 10 and defining a plurality of areas 110 on the first surface 101 of the substrate 10 around the LEDs 20.

At block 403, forming the retaining rings 30 in accordance with the area 110 by dispensing machine.

At block 404, filling the encapsulation layer 40 in the retaining ring 30 to cover the LED 20 therein.

Figure 5:
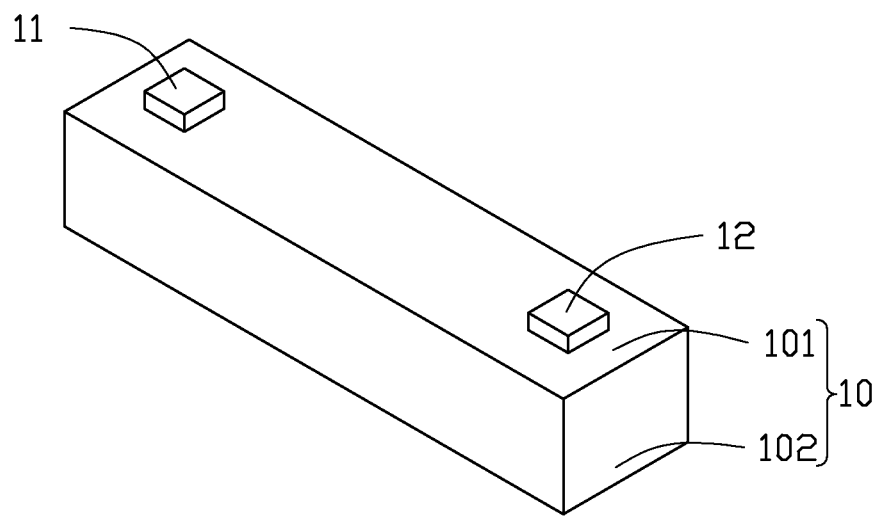
FIGS. 5-8 are isometric views showing the light emitting diode package of the present disclosure processed by various steps of the light emitting diode package method of FIG. 4.

At block 401, referring to FIG. 5, the substrate 10 includes a first surface 101 and a second surface 102 located opposite to the first surface 101. The first electrode 11 and the second electrode 12 are spaced from each other and respectively formed on two ends of the first surface 101 of the substrate 10.

Figure 6:
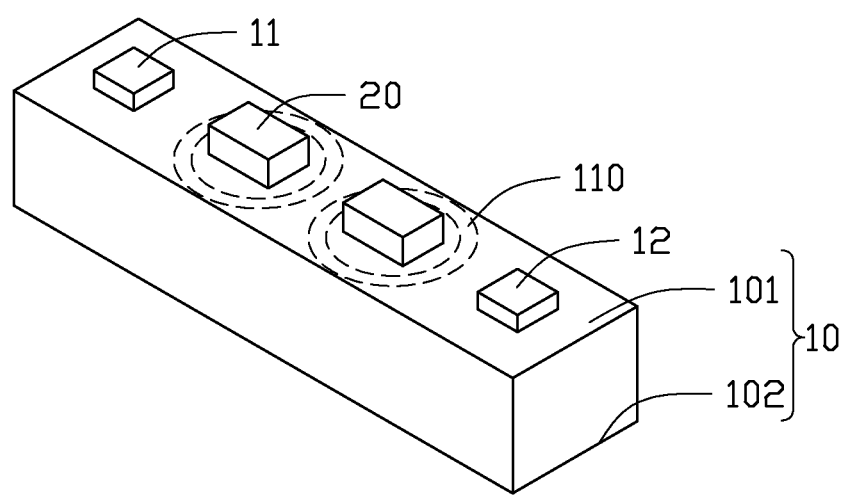

At block 402, referring to FIG. 6, the LEDs 20 are spaced from each other, and located between the first electrode 11 and the second electrode 12. Each area 110 is corresponding to an LED 20.

Figure 7:
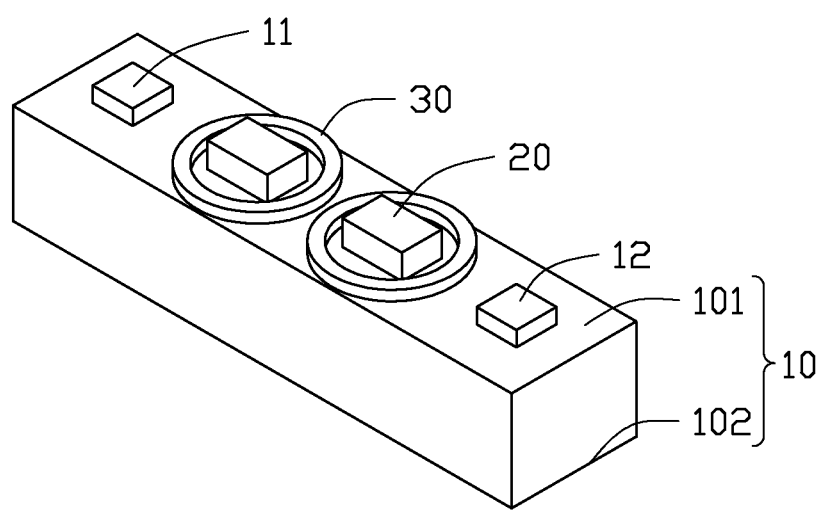

At block 403, referring to FIG. 7, a bottom surface of the retaining ring 30 is configured correspondingly to the area 110. A cross section of each retaining ring 30 is a circular shape. A height of each retaining ring 30 is H1, the H1 is between 100 μm and 300 μm, in one example, the H1 is 200 μm. The width of each retaining ring 30 is W1, the W1 is between 0.05 μm and 0.1 μm, in one example, the W1 is 0.07 μm.

Figure 8:
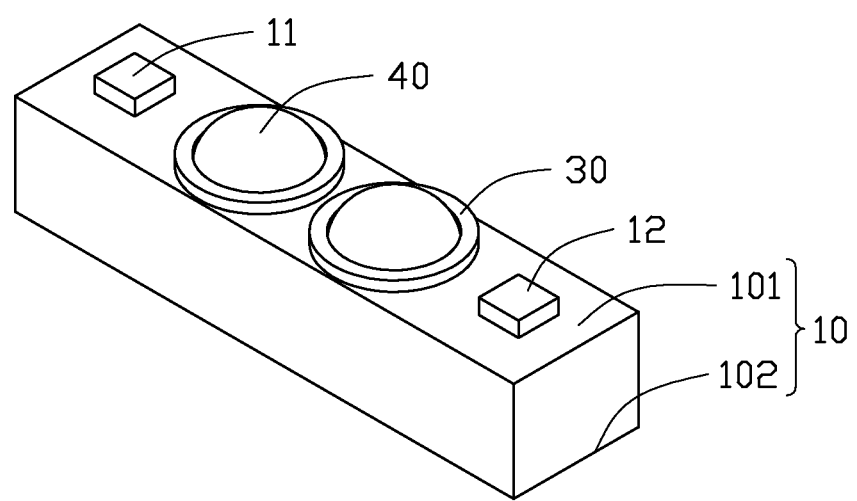

At block 404, referring to FIG. 8, the encapsulation layer 40 includes a top surface 41 and a side surface 42 extended from a periphery of the top surface 41 to the first side wall 31 of the retaining ring 30. The side surface 42 of the encapsulation layer 40 contacts to the first side wall 31 of the retaining ring 30. A shape of the encapsulation layer 40 in cross-section is substantially a half circle shape with a top portion cut. The top surface 41 is a horizontal surface. The side surface 42 is a curved surface. In the illustrated embodiment, the side surface 42 of the encapsulation layer 40 and the first side wall 31 of the retaining ring 30 define an angle A, the angle A is between 30° and 60°, in one example, the angle A is 45°. A height of the encapsulation layer 40 is labeled H2, the height can be between 1 mm and 3 mm, in one example, the H2 can be 2 mm. The encapsulation layer 40 is rotational symmetrical about an axis 21 of the corresponding LED 20.

In the present disclosure, while forming the encapsulation layer 40, the retaining ring 30 makes the encapsulation layer 40 gather together to be symmetrical about the axis 21. An outer surface of the encapsulation layer 40 is perfectly uniform to exit light evenly.

The embodiments shown and described above are only examples. Many details are often found in the art such as the other features of a light emitting diode package and method thereof. Therefore, many such details are neither shown nor described. Even though numerous characteristics and advantages of the present technology have been set forth in the foregoing description, together with details of the structure and function of the present disclosure, the disclosure is illustrative only, and changes can be made in the detail, including in matters of shape, size and arrangement of the parts within the principles of the present disclosure up to, and including the full extent established by the broad general meaning of the terms used in the claims. It will therefore be appreciated that the embodiments described above can be modified within the scope of the claims.

What is claimed is:

1. A light emitting diode (LED) package, comprising:
    a substrate having a first surface and a second surface located opposite to the first surface;
    a first electrode mounted on the first surface;
    a second electrode mounted on the first surface;
    a plurality of LEDs mounted on the first surface;
    a plurality of retaining rings formed on the first surface, each of the plurality of retaining rings surrounding a corresponding LED therein; and
    a plurality of encapsulation layer filled in the retaining rings and each of the plurality of encapsulation layers covering the corresponding LED therein;
    wherein a width of each retaining ring is between 0.05 μm and 0.1 μm, a height of each retaining ring is between 100 μm and 300 μm.

2. The LED package of claim 1, wherein the retaining ring comprises a first side wall, a second side wall located on the first surface of the substrate, and a top wall connecting with the first side wall and the second side wall.

3. The LED package of claim 2, wherein each encapsulation layer comprises a top surface and a side surface extended from a periphery of the top surface to the first side wall of the retaining ring, the side surface of the encapsulation layer contacts the first side wall of the retaining ring.

4. The LED package of claim 3, wherein the side of the encapsulation layer and the first side wall of the retaining ring define an angle, and the angle is between 30° and 60°.

5. The LED package of claim 2, wherein the first side wall and the second side wall of the retaining ring both are arc surfaces extending vertically from the first surface of the substrate, and the top wall of the retaining surface is arc surface parallel to the first surface of the substrate.

6. The LED package of claim 1, wherein the retaining ring is made of hydrophobic material.

7. The LED package of claim 6, wherein each retaining ring is a circular shape.

8. The LED package of claim 1, wherein a height of each encapsulation layer is between 1 mm and 3 mm.

9. The LED package of claim 1, wherein each encapsulation layer is rotational symmetrical about an axis of the corresponding LED.

10. The LED package of claim 1, wherein the encapsulation layer is made of glue and has phosphors mixed in the glue.

11. The LED package of claim 1, wherein the first electrode and the second electrode are spaced from each other and respectively mounted on two ends of the first surface of the substrate.

12. The LED package of claim 1, wherein the LEDs are located between the first electrode and the second electrode.

13. A method for manufacturing the LED package, comprising:
    providing a substrate and forming a first electrode and a second electrode on the substrate;
    configuring a plurality of LEDs on the substrate and defining a corresponding area on a first surface around the LEDs;
    forming a retaining ring in the area; and
    filling a encapsulation layer within the retain ring to cover the LED therein;

wherein a width of each retaining ring is between 0.05 μm and 0.1 μm, a height of each retaining ring is between 100 μm and 300 μm.

14. The method of claim 13, wherein the retaining ring comprises a first side wall, a second side wall connecting with the first surface of the substrate, and a top wall connecting with the first side wall and the second side wall.

15. The method of claim 13, wherein each encapsulation layer comprises a top surface and a side surface extended from a periphery of the top surface to the first side wall of the retaining ring, the side surface of the encapsulation layer contacts to the first side wall of the retaining ring.

16. The method of claim 13, wherein each retaining ring is a circular shape.

\* \* \* \* \*